United States Patent
Fujita et al.

(10) Patent No.: US 11,201,486 B2
(45) Date of Patent: Dec. 14, 2021

(54) BATTERY CONTROL DEVICE, CHARGE AND DISCHARGE SYSTEM, PARKING LOT SYSTEM, SECONDARY BATTERY REUSE SYSTEM, BATTERY CONTROL METHOD, AND NON-TRANSITORY STORAGE MEDIUM

(71) Applicant: KABUSHIKI KAISHA TOSHIBA, Minato-ku (JP)

(72) Inventors: Yumi Fujita, Tokyo (JP); Tomokazu Morita, Funabashi (JP); Nobukatsu Sugiyama, Kawasaki (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 114 days.

(21) Appl. No.: 16/804,611

(22) Filed: Feb. 28, 2020

(65) Prior Publication Data
US 2021/0083497 A1 Mar. 18, 2021

(30) Foreign Application Priority Data
Sep. 17, 2019 (JP) .............................. JP2019-168411

(51) Int. Cl.
*H02J 7/00* (2006.01)
*H02J 7/14* (2006.01)
(Continued)

(52) U.S. Cl.
CPC ............ *H02J 7/0048* (2020.01); *B60L 50/66* (2019.02); *B60L 53/80* (2019.02); *B60L 58/12* (2019.02);
(Continued)

(58) Field of Classification Search
USPC ......................................................... 320/109
See application file for complete search history.

(56) References Cited

U.S. PATENT DOCUMENTS

| 6,949,915 B2* | 9/2005 | Stanley | ............... H02M 1/4208 323/207 |
| 7,403,400 B2* | 7/2008 | Stanley | ............... H02M 1/4208 363/16 |

(Continued)

FOREIGN PATENT DOCUMENTS

| EP | 2 530 482 A2 | 12/2012 |
| JP | 2010-236925 A | 10/2010 |

(Continued)

OTHER PUBLICATIONS

"Start of Empirical Research on Battery Sharing Using Detachable Portable Battery and Electric Motorcycle in Indonesia," Honda motor industry stock company, (with English translation), https://www.honda.com.jp/news/2018/c180713.html, 2018, 5 pages.

(Continued)

*Primary Examiner* — Alexis B Pacheco
(74) *Attorney, Agent, or Firm* — Oblon, McClelland, Maier & Neustadt, L.L.P.

(57) ABSTRACT

According to one embodiment, a battery control device includes a charge and discharge circuit and a processor. The processor determines, based on an information regarding a secondary battery electrically connected to the charge and discharge circuit, whether or not a diagnosis implementation condition is satisfied; controls the charge and discharge circuit to charge the secondary battery only after discharging or charging up to a charging-start SOC if the diagnosis implementation condition is satisfied; acquires measurement data of a voltage and a current of the secondary battery while charging; estimates an internal state parameter of the secondary battery based on the measurement data; and diagnoses a deterioration state of the secondary battery based on the internal state parameter of the secondary battery.

18 Claims, 3 Drawing Sheets

(51) Int. Cl.
 *B60L 50/60* (2019.01)
 *B60L 58/12* (2019.01)
 *B60L 53/80* (2019.01)
(52) U.S. Cl.
 CPC .............. *H02J 7/005* (2020.01); *H02J 7/007* (2013.01); *H02J 7/0013* (2013.01); *B60L 2240/547* (2013.01); *B60L 2240/549* (2013.01)

(56) References Cited

U.S. PATENT DOCUMENTS

| | | |
|---|---|---|
| 10,027,136 B2 | 7/2018 | Sugiyama et al. |
| 10,274,545 B2 | 4/2019 | Sugiyama et al. |
| 10,338,144 B2 | 7/2019 | Sugiyama et al. |
| 2006/0145658 A1* | 7/2006 | Wang ................ H02J 7/007182 320/107 |
| 2010/0250038 A1 | 9/2010 | Morita et al. |
| 2013/0049471 A1* | 2/2013 | Oleynik ................ H02J 7/0069 307/65 |
| 2014/0015496 A1* | 1/2014 | Nishiguchi ............. H02M 1/42 320/162 |
| 2014/0222358 A1 | 8/2014 | Morita et al. |
| 2015/0160300 A1 | 6/2015 | Ishii et al. |
| 2016/0011274 A1 | 1/2016 | Morita et al. |
| 2016/0380313 A1 | 12/2016 | Morita et al. |
| 2017/0263984 A1 | 9/2017 | Fujita et al. |
| 2018/0006335 A1 | 1/2018 | Fujita et al. |
| 2018/0267108 A1 | 9/2018 | Morita et al. |
| 2018/0313906 A1 | 11/2018 | Takahashi et al. |
| 2019/0178949 A1 | 6/2019 | Park et al. |
| 2019/0198938 A1 | 6/2019 | Fujita et al. |
| 2020/0284845 A1 | 9/2020 | Fujita et al. |

FOREIGN PATENT DOCUMENTS

| | | |
|---|---|---|
| JP | 2012-251806 A | 12/2012 |
| JP | 2014-149280 A | 8/2014 |
| JP | 2014-190763 A | 10/2014 |
| JP | 2015-111086 A | 6/2015 |
| JP | 2015-175753 A | 10/2015 |
| JP | 2015-178963 A | 10/2015 |
| JP | 2017-139927 A | 8/2017 |
| JP | 2017-166874 A | 9/2017 |
| JP | 2018-46678 A | 3/2018 |
| JP | 2018-156739 A | 10/2018 |
| JP | 2019-57382 A | 4/2019 |
| JP | 2020-145816 A | 9/2020 |
| WO | WO 2016/038658 A1 | 3/2016 |
| WO | WO 2017/046870 A1 | 3/2017 |

OTHER PUBLICATIONS

"Notebook PC "Battery diagnosis and control program" installation request," Panasonic Corporation announcement, (with English translation), http://askpc.panasonic.co.jp/info/180328.html, 2018, 6 pages.
"A laptop computer manufactured by Panasonic Corporation will be recalled (delivery of anti-virus software)," Ministry of Economy, Trade and Industry, (with English translation), http://www.meti.go.ip/press/2017/03/20180328005/20180328005.html, Mar. 2018, 7 pages.

* cited by examiner

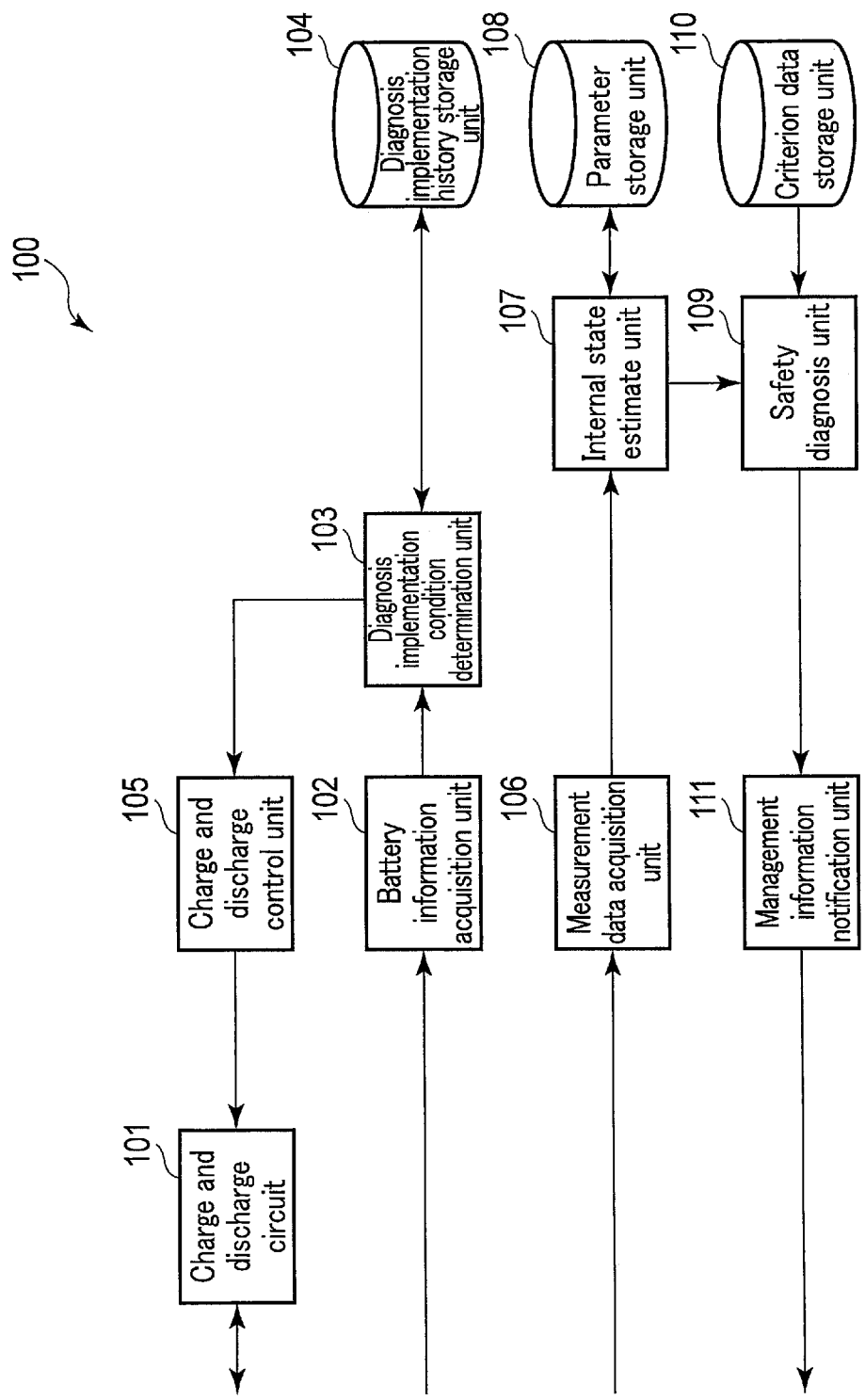
F I G. 1

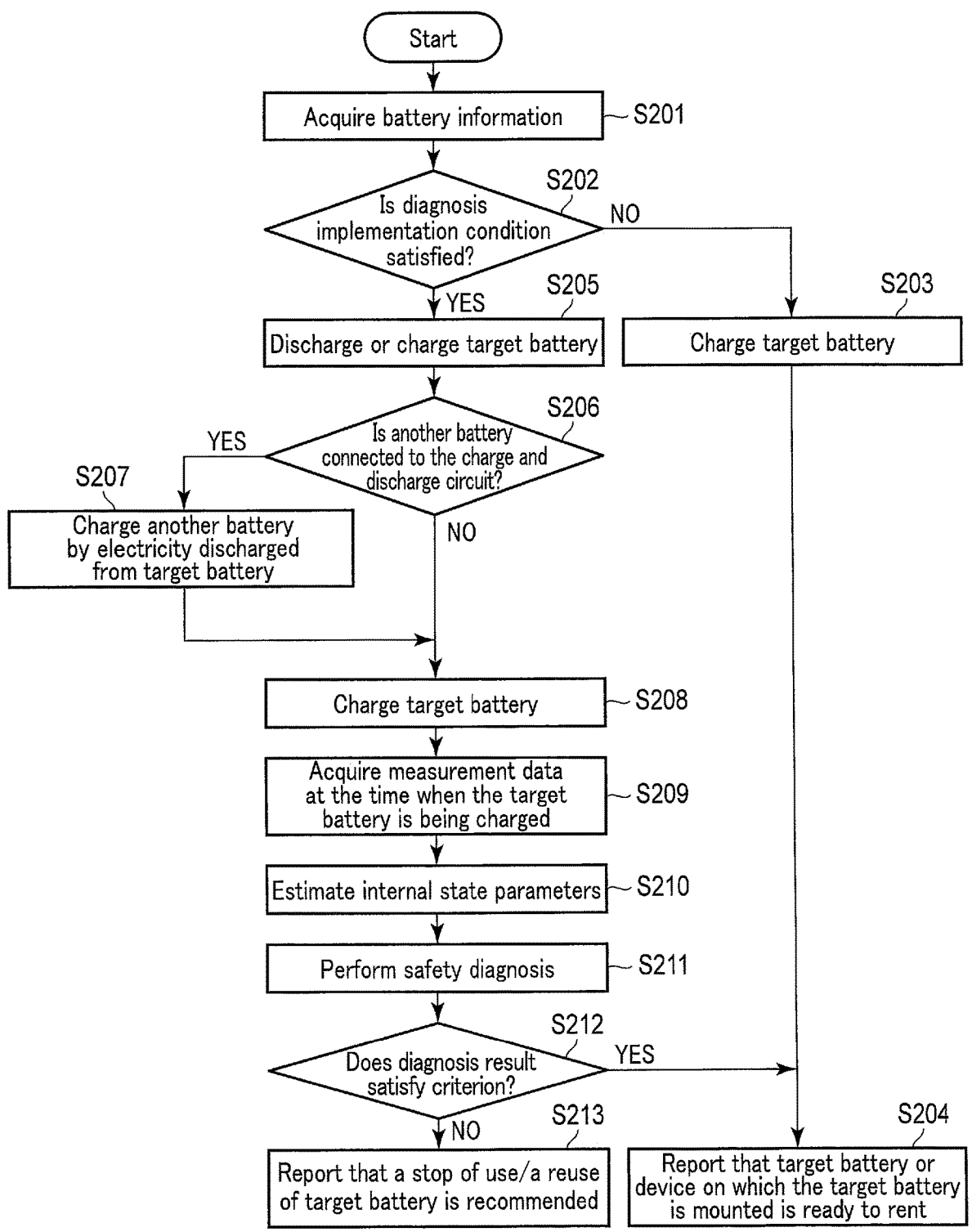
F I G. 4

BATTERY CONTROL DEVICE, CHARGE AND DISCHARGE SYSTEM, PARKING LOT SYSTEM, SECONDARY BATTERY REUSE SYSTEM, BATTERY CONTROL METHOD, AND NON-TRANSITORY STORAGE MEDIUM

CROSS-REFERENCE TO RELATED APPLICATIONS

This application is based upon and claims the benefit of priority from Japanese Patent Application No. 2019-168411, filed Sep. 17, 2019; the entire contents of which are incorporated herein by reference.

FIELD

Embodiments relate generally to a battery control device, a charge and discharge system, a parking lot system, a secondary battery reuse system, a battery control method, and a no-transitory storage medium.

BACKGROUND

In recent years, the automobile field has promoted conversion from gasoline cars to electric vehicles (EV) and plug-in hybrid electric vehicles (PHEV) for their smaller impact on the environment. It is expected that this trend will lead to continuous growth of the EV market and expansion of charging infrastructure. On the other hand, the sharing economy has become more and more popular worldwide. For example, carsharing and ridesharing have been attracting attentions in the automobile field. Under these circumstances, EV carsharing may become popular in the future.

EVs run on electricity discharged from a secondary battery, such as a lithium-ion battery (LIB), as an energy source. It has been reported that safety of LIBs deteriorates due to their cycle degradation.

BRIEF DESCRIPTION OF THE DRAWINGS

FIG. 1 is a block diagram showing a battery control device according to an embodiment.

FIG. 4 is a flowchart showing an operation of the battery control device shown in FIG. 1.

DETAILED DESCRIPTION

Figure 2:
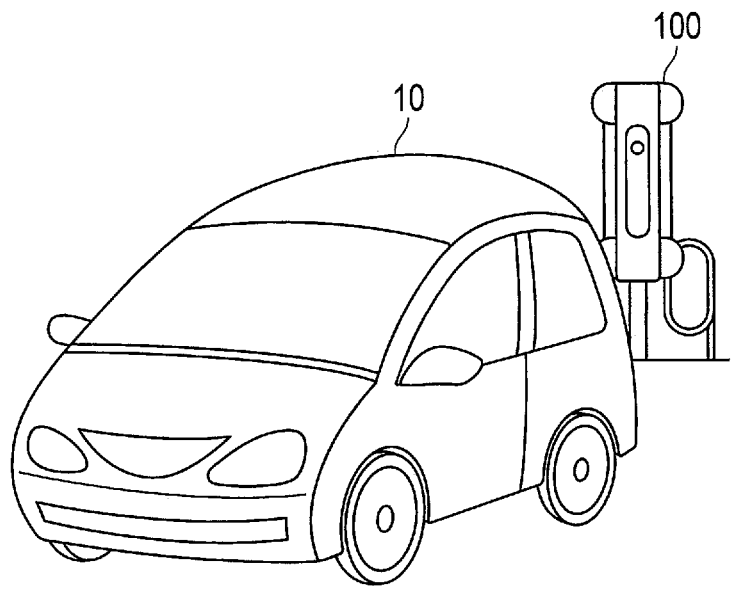
FIG. 2 is a diagram showing an appearance of a parking lot system which includes the battery control device shown in FIG. 1.

According to one embodiment, a battery control device includes a charge and discharge circuit capable of charging and discharging an electrically connected secondary battery, and a processor configured to control the charge and discharge circuit. The processor is configured to: acquire information regarding a first secondary battery electrically connected to the charge and discharge circuit; determine whether or not a diagnosis implementation condition regarding the first secondary battery is satisfied based on information regarding the first secondary battery; control the charge and discharge circuit to charge the first secondary battery only after discharging or charging the first secondary battery up to a charging-start state of charge (SOC) if it is determined that the diagnosis implementation condition is satisfied; acquire measurement data of a voltage and a current of the first secondary battery while the first secondary battery is being charged from the charging start SOC; estimate an internal state parameter of the first secondary battery based on the measurement data; and diagnose a deterioration state of the first secondary battery based on an estimated value of the internal state parameter of the first secondary battery.

Embodiments will be described hereinafter with reference to the accompanying drawings. Hereinafter, an element same as or similar to an already-explained element will be denoted with a same or similar reference symbol, and duplicate descriptions will be avoided.

EMBODIMENTS

FIG. 1 is a block diagram showing a battery control device according to an embodiment. As shown in FIG. 1, a battery control device 100 according to the embodiment includes a charge and discharge circuit 101, a battery information acquisition unit 102, a diagnosis implementation condition determination unit 103, a diagnosis implementation history storage unit 104, a charge and discharge control unit 105, a measurement data acquisition unit 106, an internal state estimate unit 107, a parameter storage unit 108, a safety diagnosis unit 109, a criterion data storage unit 110, and a management information notification unit 111.

The charge and discharge circuit 101 can charge and discharge a secondary battery electrically connected to the charge and discharge circuit 101. Specifically, the charge and discharge circuit 101 charges and discharges the secondary battery in accordance with a control of the charge and discharge control unit 105. The charge and discharge circuit 101 is electrically connected to an external power source (not shown), and controls a current flowing from the external power source to a secondary battery and vice versa, thereby charging and discharging the secondary battery. As one example, the charge and discharge circuit 101 is provided with a voltmeter capable of measuring a voltage between a positive electrode terminal and a negative electrode terminal of the secondary battery connected to the charge and discharge circuit 101, and an ammeter capable of measuring a current flowing in the connected secondary battery. The charge and discharge circuit 101 may be provided with a temperature sensor capable of measuring a temperature of the connected secondary battery. As another example, the aforementioned ammeter, voltmeter, and temperature sensor are provided in a device on which the secondary battery connected to the charge and discharge circuit 101 is mounted.

Herein, the secondary battery may be a nonaqueous electrolyte secondary battery such as a lithium-ion secondary battery, or a battery module having a plurality of nonaqueous electrolyte secondary batteries. Furthermore, the secondary battery may be electrically coupled to the charge and discharge circuit 101 after being removed from a device (namely, a changeable-type secondary battery), or electrically coupled to the charge and discharge circuit 101 while being mounted on the device.

The device on which the secondary battery is mounted is typically a vehicle using electricity discharged from the secondary battery, but is not limited thereto; the device may be a drone or a smart phone, for example. The vehicle may be an electric vehicle, a plug-in hybrid electric vehicle, or an electric motorbike.

If the device on which the secondary battery is mounted is any of these vehicles, the battery control device 100 may be included in a charging infrastructure installed in a parking lot as shown in FIG. 2 (for example, a charging station). FIG. 2 is a diagram showing an appearance of a parking lot system which includes the battery control device shown in FIG. 1. After an EV 10 is parked in a parking lot and the secondary battery mounted on the EV 10 is electrically connected to the charge and discharge circuit 101, the battery control device 100 charges the secondary battery, and diagnoses the safety and the deterioration state of the secondary battery under a certain condition. A single or a plurality of battery control devices 100 thus installed in a parking lot may be called a parking lot system. The charge and discharge circuits 101 of the plurality of battery control devices 100 may share an electric network, and may share the electricity to another charge and discharge circuit 101.

A parking lot is not limited to a public parking lot, such as a coin-operated parking or a free parking lot, and may include a parking lot for specific users, such as a parking lot at a shopping center, an apartment house, a factory, a taxi office, or a bus switching yard.

The device on which the secondary battery is mounted may be used for a rental service to non-specific users. As an example, the device on which the secondary battery is mounted may be an EV used for an EV sharing service. In this case, the secondary battery will be electrically connected to the charge and discharge circuit 101 after a user returns the device on which the secondary battery is mounted.

A plurality of secondary batteries may be electrically connected to the charge and discharge circuit 101. In this case, the charge and discharge circuit 101 can charge one of the secondary batteries using the electricity discharged from the other secondary battery in accordance with the control of the charge and discharge control unit 105.

The battery information acquisition unit 102 acquires information (hereinafter this may be referred to as "battery information") relating to the secondary battery targeted for the charging and discharging by the charge and discharge circuit 101. The battery information may include an identifier for identifying the secondary battery and/or a state of charge (SOC) of the secondary battery or information that can be a factor for estimating the SOC. The battery information acquisition unit 102 sends the acquired battery information to the diagnosis implementation condition determination unit 103. Examples of information that can be a factor for estimating a SOC of the secondary battery are a current measured by the aforementioned ammeter, and a history of charging and discharging of the secondary battery.

A bar code of the secondary battery identifier may be adhered or printed on the secondary battery or the device on which the secondary battery is mounted (e.g., a vehicle). In this case, the battery information acquisition unit 102 can acquire the secondary battery identifier by decoding the bar code shown in image data acquired by a camera, for example.

Alternatively, instead of the bar code, the identifier itself may be adhered or printed on the secondary battery or the device on which the secondary battery is mounted. In this case, the battery information acquisition unit 102 can acquire the secondary battery identifier by performing optical character recognition (OCR) processing on the identifier shown on image data acquired by a camera, for example.

An RFID tag for sending the secondary battery identifier may be attached to the secondary battery or the device on which the secondary battery is mounted. In this case, the battery information acquisition unit 102 may acquire the received secondary battery identifier via a communication interface (I/F), for example.

The SOC of the secondary battery may be calculated by a controller connected to the secondary battery or the device on which the secondary battery is mounted (e.g., a vehicle) for example, and sent to an external device. In this case, the battery information acquisition unit 102 can acquire the received SOC of the secondary battery via the communication I/F, for example.

Alternatively, instead of the SOC of the secondary battery, information relating to an operation history of the device on which the secondary battery is mounted, such as a driving time and a distance traveled, may be stored in the device and sent to an external device. In this case, the battery information acquisition unit 102 may estimate the SOC of the secondary battery based on the information relating to the operation history of the device received via the communication I/F, for example. To estimate the SOC of the secondary battery, the battery information acquisition unit 102 may use a function representing a relationship between a driving time or a distance traveled of the device, on which the secondary battery is mounted, and the SOC of the secondary battery. Such a function may be predefined based on a result of experiment and/or simulation, for example.

The diagnosis implementation condition determination unit 103 receives, from the battery information acquisition unit 102, the battery information of the secondary battery electrically connected to the charge and discharge circuit 101 (hereinafter, this may be referred to as "target battery"), and determines whether or not a diagnosis implementation condition relating to the target battery is satisfied based on the battery information. The diagnosis implementation condition determination unit 103 sends, to the charge and discharge control unit 105, a determination result indicating whether or not the diagnosis implementation condition relating to the target battery is satisfied.

As will be described later, the estimation of an internal state parameter, which is performed prior to a safety diagnosis of the target battery, uses measurement data at the time when the target battery in a predetermined charging-start SOC is charged. For this reason, the lower a value of the charging-start SOC is, the more substantial the measurement data becomes; thus, parameters (which will be described later) can be precisely estimated and the safety diagnosis can be performed with high reliability. On the other hand, when the SOC of the target battery exceeds the charging-start SOC, it is necessary to discharge the target battery due to a difference in the levels of these SOCs, and this may cause a waste of electricity. Assuming that the secondary battery is charged on a once-a-day basis or so, it may not always be necessary to perform the safety diagnosis every time the battery is charged, as the secondary battery deteriorates more slowly in most cases than this once-a-day charging cycle.

Specifically, the diagnosis implementation condition determination unit 103 may determine whether or not a diagnosis implementation condition is satisfied on the basis of the implementation history of the safety diagnosis of the target battery and/or the SOC of the target battery. The diagnosis implementation condition may include a condition that a time elapsed since the safety diagnosis was last performed on the target battery must exceed a threshold value, for example three months. The diagnosis implementation condition may also include a condition that the SOC of the target battery be equal to or lower than a threshold value, for example 20%. Furthermore, the diagnosis implementation condition may include a condition that a time elapsed since the safety diagnosis was last performed on the target battery must exceed a threshold value, for example one month/two months, and the SOC of the target battery be equal to or lower than a threshold value, for example 30%/40%. As an example, the diagnosis implementation condition relating to both of the elapsed time and the SOC may be determined in such a manner that the greater a threshold relating to the elapsed time becomes, the greater a threshold relating to the SOC becomes.

The diagnosis implementation condition determination unit 103 may read an implementation history of the safety diagnosis of the target battery from the diagnosis implementation history storage unit 104. Herein, the diagnosis implementation history storage unit 104 may store a database in which the secondary battery identifier is associated with the implementation history of the safety diagnosis of the secondary battery. In this case, the diagnosis implementation condition determination unit 103 can search the diagnosis implementation history storage unit 104 for a last day or time the safety diagnosis was performed on the target battery, using the target battery identifier as a key.

Herein, the implementation history includes at least a day or time of the last safety diagnosis performed on the secondary battery. Other than that, the implementation history may include the following: a result of the past safety diagnosis performed on the secondary battery, a result of estimating internal state parameters/battery characteristic parameters used as bases for the safety diagnosis, measurement data used as a basis for the estimation of the internal state parameters/battery characteristic parameters, information provided by the management information notification unit 111 (which will be described later), and the like.

As mentioned, the diagnosis implementation history storage unit 104 may store a database in which the secondary battery identifier is associated with the implementation history of the safety diagnosis of the secondary battery. The diagnosis implementation history storage unit 104 may be provided in a server connectible to the battery control device 100 via a network. In this case, the battery control device 100 may request, via the network, that this diagnosis implementation history storage unit 104 search for the implementation history of the safety diagnosis of the secondary battery associated with a predetermined identifier. It is thus possible to centrally manage the history of the safety diagnoses performed by different battery control devices 100. The implementation history of the safety diagnosis stored in the diagnosis implementation history storage unit 104 may be updated by various function units included in the battery control device 100.

The charge and discharge control unit 105 receives, from the diagnosis implementation condition determination unit 103, a determination result as to whether or not a diagnosis implementation condition relating to the target battery is satisfied. If it is determined that a diagnosis implementation condition is satisfied, the charge and discharge control unit 105 controls the charge and discharge circuit 101 to charge the target battery only after discharging the target battery up to a predetermined charging-start SOC. If the SOC of the target battery is lower than the predetermined charging-start SOC, the discharging is not performed, and the target battery is charged up to the predetermined charging-start SOC. In contrast, if it is determined that a diagnosis implementation condition is not satisfied, the charge and discharge control unit 105 may control the charge and discharge circuit 101 to simply charge the target battery.

Herein, the charging-start SOC is determined to be 20%, for example. The charging-start SOC may be the same for any target battery or may differ between target batteries. In the latter case, the charging-start SOC is variable depending on a type of the target battery (for example, a composition of an active material), the implementation history of the safety diagnosis of the target battery, and so on. The charging from the predetermined charging-start SOC may be defined to be equal to or lower than a current value 1C, for example. The conditions for the charging-start SOC and the charging current are determined within a range acceptable for the characteristic of the secondary battery and the method performed by the internal state estimation unit.

If it is determined that the diagnosis implementation condition regarding the target battery is satisfied, and another secondary battery that needs to be charged is electrically connected to the charge and discharge circuit 101, the charge and discharge control unit 105 may control the charge and discharge circuit 101 to charge this another secondary battery with electricity discharged from the target battery when the target battery is discharged up to the predetermined charging-start SOC. It is thereby possible to reduce a waste of electricity caused by discharging of the target battery. For example, if the diagnosis implementation condition determination unit 103 of the battery control device 100 included in a parking lot system determines that a diagnosis condition relating to the target battery mounted on an EV is satisfied, and a secondary battery mounted on another EV that needs to be charged is electrically connected the charge and discharge circuit 101 of the battery control device 100, the charge and discharge control unit 105 of the battery control device 100 may control the charge and discharge circuit 101 to charge the secondary battery mounted on this another EV with electricity discharged from the target battery, when the target battery is discharged up to the predetermined charging-start SOC. The above-described control on the charge and discharge circuit 101 performed by the battery control device 100 in the parking lot system is applicable even to a case where a device on which the secondary battery is mounted is other than an automobile. In other words, as long as the system is a charge and discharge system in which a plurality of devices on which a secondary battery is respectively mounted are provided, the above-described control of the charge and discharge circuit 101 performed by the battery control device 100 is applicable.

Furthermore, in order to improve an implementation rate of such efficient charging, if, for example, a diagnosis implementation condition relating to a first secondary battery is not satisfied, the charge and discharge control unit 105 may put off the charging of the first secondary battery until a second secondary battery for which it is determined that a diagnosis implementation condition is satisfied appears. An upper limit can be determined for this stand-by time based on, for example, a time required for charging a first secondary battery, or a scheduled next use thereof. It is thereby possible to charge a first secondary battery through actively using electricity discharged from a second secondary battery, without disrupting a use cycle demanded of the first secondary battery.

The measurement data acquisition unit 106 acquires, from the target battery or via the charge and discharge circuit 101, measurement data of a measurement result of electric characteristics of the target battery at a plurality points of time during the time of charging the target battery. The measurement data, which is acquired by the measurement data acquisition unit 106 while the target battery is being charged from the charging start SOC, includes measurement data representing a relationship of a voltage and a current of the target battery relative to the charging time. Herein, the electric characteristics include a voltmeter-measurable voltage between the positive electrode terminal and the negative electrode terminal of the target battery, and an ammeter-measurable current flowing in the target battery. The electric characteristics include a temperature of the target battery measured by the temperature sensor. The acquisition of the measurement data may be achieved as needed between a time when the secondary battery is connected to the charge and discharge circuit and a time when the secondary battery is removed from the charge and discharge circuit after the secondary battery is discharged or charged up to a predetermined charging-start SOC and the charging is completed. The measurement data acquisition unit 106 sends the acquired measurement data to the internal state estimate unit 107.

The internal state estimate unit 107 receives the measurement data from the measurement data acquisition unit 106, and estimates internal state parameters of the target battery based on the measurement data. Specifically, the internal state estimate unit 107 analyzes the measurement data representing the relationship of a voltage and a current of the target battery relative to a charging time. In one example, the internal state estimate unit 107 may perform an analysis on a charging curve of the target battery which is represented by the measurement data, in other words, a charging curve analysis. The internal state parameters may include some or all of the following: a positive electrode capacitance (or a positive electrode mass), a negative electrode capacitance (or a negative electrode mass), an initial charging amount of a positive electrode, an initial charging amount of a negative electrode, and an internal resistance.

Furthermore, the internal state estimate unit 107 may estimate battery characteristic parameters of the target battery based on the estimated internal state parameters. The battery characteristic parameters may include, for example, some or all of the following: an open circuit voltage (OCV), an OCV curve, and a battery capacitance. Furthermore, the aforementioned internal resistance may be included in the battery characteristic parameters. Herein, the OCV curve represents a function expressing a relationship between a certain index other than the OCV of the target battery (for example the internal state parameter or the battery characteristic parameter) and a corresponding OCV. The battery capacitance corresponds to an overlapping portion of a range of the positive electrode capacitance (namely, a range from an initial charging amount to an upper limit charging amount of the positive electrode) and a range of the negative electrode capacitance (namely, a range from an initial charging amount to an upper limit charging amount of the negative electrode).

The internal state estimate unit 107 may read necessary parameters from the parameter storage unit 108 and use them to estimate the internal state parameters and the battery characteristic parameters. For example, the internal state estimate unit 107 may read the following parameters: a function that returns an open circuit potential (OCP) of the positive electrode corresponding to the SOC of the positive electrode, a function that returns an OCP of the negative electrode corresponding to the SOC of the negative electrode, an upper limit voltage and a lower limit voltage imposed on the OCV, an intermediate estimated value of a parameter for acquiring a final estimation result of a parameter of the target battery, and so on. The internal state estimate unit 107 may store, among the estimated parameters, parameters necessary for future parameter estimation in the parameter storage unit 108.

The charging curve analysis is publicly known through, for example, Jpn. Pat. Appln. KOKAI Publication No. 2017-166874, and the internal state estimate unit 107 can estimate the internal state parameters of the target battery, and, if necessary, the battery characteristic parameters of the target battery, through using the publicly-known method.

The internal state estimate unit 107 sends, to the safety diagnosis unit 109, parameters necessary for the safety diagnosis of the target battery, among the estimated internal state parameters and battery characteristic parameters.

The parameter storage unit 108 stores parameters necessary for the internal state estimate unit 107 to estimate the internal state parameters and the battery characteristic parameters. Specific examples of what is stored in the parameter storage unit 108 are as described above.

The safety diagnosis unit 109 receives an estimation result of parameters of the target battery from the internal state estimate unit 107, and diagnoses the target battery for its safety and remaining life span, etc. based on the received estimation result, and diagnoses a deterioration state of the target battery. Specifically, the safety diagnosis unit 109 reads, from the criterion data storage unit 110, criterion data indicating a criterion corresponding to each of at least one diagnosis item relating to the safety of the target battery. Then, the safety diagnosis unit 109 diagnoses, for each diagnosis item, the estimation result of parameters of the target battery to determine whether or not the estimation result satisfies the criterion. The safety diagnosis unit 109 sends a diagnosis result on the safety of the target battery to the management information notification unit 111.

The safety diagnosis unit 109 may predict the life span of the target battery based on the diagnosis result on the safety of the target battery. The safety diagnosis unit 109 may predict a specific value as the life span of the target battery, for example three years, or may grade the life span into five ranks, for example. The safety diagnosis unit 109 may send the predicted life span of the target battery to the management information notification unit 111, along with the diagnosis result of the target battery. Furthermore, the predicted life span of the target battery may be sent to an external device to lay out a reuse program (which will be described later), for example.

Herein, the criterion data may indicate a normal numerical range for a corresponding parameter. In this case, with respect to a certain diagnosis item, if the parameter estimation result deviates from the numerical range of the criterion data, the safety diagnosis unit 109 may diagnose the target battery as not satisfying the criterion for the diagnosis item. On the other hand, with respect to a certain diagnosis item, if the parameter estimation result falls within the numerical range of the criterion data, the safety diagnosis unit 109 may diagnose the target battery as satisfying the criterion for the diagnosis item.

The diagnosis items may include some or all of the following: a positive electrode capacitance, a negative electrode capacitance, and a difference between an initial charging amount of the positive electrode and an initial charging amount of the negative electrode. The safety diagnosis unit 109 may diagnose the target battery as failing to satisfy the criterion for the positive electrode capacitance, if the estimation result for the positive electrode capacitance of the target battery is smaller than a threshold value indicated by the criterion data regarding the positive electrode capacitance. The safety diagnosis unit 109 may diagnose the target battery as failing to satisfy the criterion for the negative electrode capacitance, if the estimation result for the negative electrode capacitance of the target battery is smaller than a threshold value indicated by the criterion data regarding the negative electrode capacitance. Furthermore, if a difference between an estimation result of the initial charging amount of the positive electrode and an estimation result of the initial charging amount of the negative electrode exceeds a threshold indicated by the criterion data regarding a difference between the initial charging amount of the positive electrode and the initial charging amount of the negative electrode in the target battery, the safety diagnosis unit 109 may diagnose the target battery as failing to satisfy a criterion regarding said difference.

The criterion data storage unit 110 stores criterion data for each diagnosis item. The criterion data may be variable depending on a type of the target battery (for example, a composition of an active material), a type of a device on which the target battery is mounted (for example, whether it is an EV or a stationary rechargeable battery), and an implementation history of the safety diagnosis of the target battery.

The management information notification unit 111 receives, from the safety diagnosis unit 109, a diagnosis result on the safety of the target battery, namely a diagnosis result on the deterioration state of the target battery, and notifies, for example, an owner or a manager of the target battery and the device on which the target battery is mounted of management information relating to the target battery or the device based on the diagnosis result. For example, the management information notification unit 111 may output, from an output device connected to the battery control device 100, such as a display or a speaker, content for reporting the management information, such as text, static images, moving images, or sound. Alternatively, the management information notification unit 111 may send a message, for example, an email or an SNS message, to notify an address associated with the target battery or the device on which the target battery is mounted of the management information, via the communication I/F.

The management information notification unit 111 may report that a stop of use of the target battery is recommended, if the target battery is diagnosed as failing to satisfy at least one diagnosis item. It is thus possible to dissuade the owner or the manager from continuously using the target battery, and to prevent accidents due to deterioration of the target battery.

The management information notification unit 111 may report that a reuse of the target battery is recommended instead of or in addition to the reporting that a stop of use of the target battery is recommended, if the target battery is diagnosed as failing to satisfy at least one diagnosis item.

Figure 3:
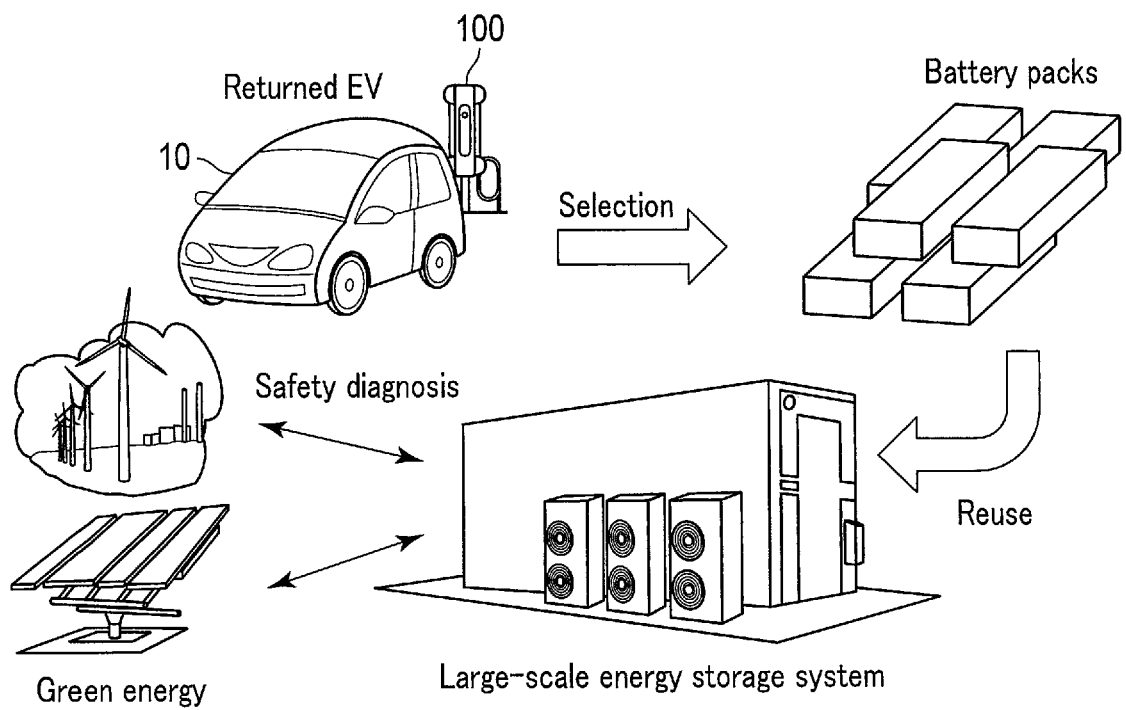
FIG. 3 is a diagram showing a secondary battery reuse system in which an EV on-board secondary battery is reused as a stationary rechargeable battery.

Whereas a criterion for the safety of a secondary battery mounted on a vehicle such as an EV is strictly defined so as to prevent any critical accidents due to malfunctioning of the battery, the same level of strictness may not be required for a criterion for a secondary battery which is mounted on a battery product other than a vehicle, such as a stationary rechargeable battery. Accordingly, as shown in FIG. 3, for example, a business model wherein a secondary battery having a predicted life span longer than a certain length among secondary batteries mounted on an EV, in other words, a secondary battery in which deterioration is not so advanced, is selected and collected, and remanufactured as a stationary rechargeable battery, may be possible. FIG. 3 is a diagram showing secondary battery reuse system in which an EV on-board secondary battery is reused as a stationary rechargeable battery. Such a stationary rechargeable battery can be used as a storage for green energy, such as wind energy and solar energy, in a large-scale energy storage system.

When reporting that a reuse of the target battery is recommended, the management information notification unit 111 may further report a reuse program available for the target battery. In this case, a reuse program for the target battery may be externally provided, for example to an owner of the target battery, by the management information notification unit 111. This reuse program may include a type of reuse (whether a full purchase of the target battery, a receipt of a difference in price as a result of downgrading the target battery, or a payment of a difference in price as a result of upgrading the target battery), a price regarding the reuse (a purchase price, a difference in price in the case of downgrading/upgrading), and an expiry date of the reuse, for example. The management information notification unit 111 may inquire with an external device, for example an external device (server) connectible via a network, about a reuse program available for the target battery. Furthermore, this external device may send a reuse program available to the target battery to the battery control device 100 in accordance with the inquiry (in other words, the external device may answer to the inquiry). If the owner of the target battery agrees to the reuse program, the target battery is collected, and remanufactured as a stationary rechargeable battery of a large-scale energy storage system, for example. The management information notification unit 111 may ensure that the inquiry includes a diagnosis result on safety and a deterioration rate of the target battery and/or a predicted life span. Herein, the management information notification unit 111 may acquire information indicating that the owner of the target battery has agreed to the reuse program. Upon acquisition of the information indicating that the owner has agreed to the reuse program, the management information notification unit ill may report that the target battery has been remanufactured as a secondary battery to be mounted on a battery product, such as a stationary rechargeable battery, etc.

The management information notification unit 111 does not need to report that a reuse of the target battery is recommended, if the deterioration of the target battery progresses to the extent that the reuse is difficult. Specifically, the management information notification unit 111 may report that a stop of use of the target battery is recommended without reporting that a reuse of the target battery is recommended, if the predicted life span of the target battery received from the safety diagnosis unit 109 is shorter than a threshold value.

Furthermore, the management information notification unit 111 may report that the charging of the target battery is finished, or a use or rent of the target battery or a device on which the target battery is mounted is ready, if the target battery is diagnosed as satisfying a criterion for each diagnosis item. The management information notification unit ill may also report similar management information when the charging of the target battery is finished, if it is determined that a diagnosis implementation condition relating to the target battery is not satisfied.

An example of the operation of the battery control device 100 shown in FIG. 1 will be explained with reference to FIG. 4. FIG. 4 is a flowchart showing an operation of the battery control device shown in FIG. 1. FIG. 4 shows an example of the operation of the battery control device 100 between a time when the target battery mounted on the EV 10 is electrically connected to the charge and discharge circuit 101 and a time when the charging is finished, for example.

When the operation shown in FIG. 4 starts, the battery information acquisition unit 102 acquires the battery information of the target battery (step S201). Next, the diagnosis implementation condition determination unit 103 determines whether or not the diagnosis implementation condition relating to the target battery is satisfied based on the battery information acquired in step S201 (step S202). In step S202, the processing proceeds to step S205 if it is determined that the diagnosis implementation condition is satisfied in step S202; if the condition is not satisfied, the processing proceeds to step S203.

In step S203, the charge and discharge control unit 105 controls the charge and discharge circuit 101 to charge the target battery. After step S203, the processing proceeds to step S204.

In step S204, the management information notification unit 111 reports that the target battery or the device on which the target battery is mounted is ready, and then the operation in FIG. 4 is finished. The management information notification unit 111 may report that the charging of the target battery has been finished, or that the target battery or the device on which the target battery is mounted is ready for use, instead of or in addition to the management information.

In step S205, the charge and discharge control unit 105 controls the charge and discharge circuit 101 to discharge or charge the target battery up to the charging-start SOC.

In step S205, if another secondary battery is electrically connected to the charge and discharge circuit 101, the charge and discharge control unit 105 controls the charge and discharge circuit 101 to charge this another secondary battery with electricity discharged from the target battery (step S206 and step S207).

After step S205 through step S207, the charge and discharge control unit 105 controls the charge and discharge circuit 101 to charge the target battery (step S208). Then, the measurement data acquisition unit 106 acquires measurement data at the time of charging the target battery in step S208 (step S209).

The internal state estimate unit 107 estimates the internal state parameters of the target battery, and if necessary, the battery characteristic parameters of the target battery, based on the measurement data acquired in step S209 (step S210).

The safety diagnosis unit 109 diagnoses whether or not the target battery satisfies a criterion for each of at least one diagnosis item, based on at least some of the parameters estimated in step S210 (step S211).

If a diagnosis result indicating that the target battery satisfies a criterion for each diagnosis item is acquired in step S211, the processing proceeds to step S204; if not, the processing proceeds to step S213.

In step S213, the management information notification unit 111 reports that a stop of use and/or a reuse of the target battery is recommended, and the operation shown in FIG. 4 is subsequently finished.

As described above, the battery control device according to the present embodiment determines whether or not a diagnosis implementation condition relating to a secondary battery electrically connected to the charge and discharge circuit is satisfied, and if the condition is satisfied, the secondary battery is discharged and then charged. Furthermore, this battery control device estimates parameters relating to the secondary battery based on the measurement data of the secondary battery at the time of charging, and diagnoses the secondary battery for its safety based on this estimation result. For this reason, according to this battery control device, the safety diagnosis is performed at an appropriate timing, for example when the SOC is equal to or smaller than a threshold value, and/or when a time elapsed since the last safety diagnosis exceeds a threshold value; therefore, the discharging of the secondary battery does not occur too often. In other words, according to this battery control device, it is possible to acquire sufficient measurement data with a sufficient length of charging range, while a waste of electricity caused by the discharging of a secondary battery is reduced, and to improve accuracy in parameter estimation and reliability in safety diagnosis.

Furthermore, as an option, this battery control device may charge a secondary battery electrically connected to the charge and discharge circuit through utilizing electricity discharged from another secondary battery. It is thereby possible to further reduce a waste of electricity caused by discharging of the secondary battery.

In the foregoing embodiment, several function units are explained, but the explanation is merely an example of implementation of each function unit. For example, a plurality of function units that are described as being implemented in one device may be implemented in several different devices, and a function unit that is described as being implemented in several devices may be implemented in one device.

The various function units explained in the forgoing embodiment may be realized through a use of a circuit. A circuit may be a dedicated circuit that realizes specific functions, or may be a general-purpose circuit such as a processor.

At least a part of the processing in the foregoing embodiment may be achieved by using a processor, such as a CPU and/or a GPU, a micro computer, an FPGA, or a DSP, mounted on a general-purpose computer, as basic hardware. A program that realizes the above processing may be provided in a form of a non-transitory computer-readable recording medium storing the program thereon. The program may be stored in a non-transitory recording medium in an installable or executable file format. The recording medium is for example a magnetic disk, an optical disk (CD-ROM, CD-R, DVD, etc.), a magneto-optical disk (MO, etc.), or a semiconductor memory. The recording medium may be of any type, as long as it is capable of storing a program and computer-readable. The program that realizes the foregoing processing may be stored on a computer (server) connected to a network, such as Internet, and may be downloaded onto a computer (client) via the network.

Specifically, the battery control device 100 according to the foregoing embodiment may be realized by a computer. Such a computer includes a processor and a memory, and may further include a communication I/F, an auxiliary storage device, and I/O (input/output). The processor may function as, through executing the program developed on the memory, a battery information acquisition unit 102, a diagnosis implementation condition determination unit 103, a charge and discharge control unit 105, a measurement data acquisition unit 106, an internal state estimate unit 107, a safety diagnosis unit 109, and/or a management information notification unit 111, for example. The memory and/or auxiliary storage device may include a diagnosis implementation history storage unit 104, a parameter storage unit 108, and/or a criterion data storage unit 110.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A battery control device comprising:
    a charge and discharge circuit capable of charging and discharging an electrically connected secondary battery; and
    a processor configured to control the charge and discharge circuit, wherein
    the processor is configured to:
    acquire information regarding a first secondary battery electrically connected to the charge and discharge circuit;
    determine whether or not a diagnosis implementation condition regarding the first secondary battery is satisfied based on information regarding the first secondary battery;
    control the charge and discharge circuit to charge the first secondary battery only after discharging or charging the first secondary battery up to a charging-start state of charge (SOC) if it is determined that the diagnosis implementation condition is satisfied;
    acquire measurement data of a voltage and a current of the first secondary battery while the first secondary battery is being charged from the charging start SOC;
    estimate an internal state parameter of the first secondary battery based on the measurement data; and
    diagnose a deterioration state of the first secondary battery based on an estimated value of the internal state parameter of the first secondary battery.

2. The battery control device according to claim 1, wherein
    the processor is configured to determine whether or not the diagnosis implementation condition is satisfied based on at least either one of an implementation history of diagnosis of a deterioration state of the first secondary battery or a SOC of the first secondary battery, and
    the SOC of the first secondary battery is included in the information relating to the first secondary battery, or estimated based on the information relating to the first secondary battery.

3. The battery control device according to claim 1, wherein
    if it is determined that the diagnosis implementation condition is satisfied and a second secondary battery differing from the first secondary battery is electrically connected to the charge and discharge circuit, the processor is configured to control the charge and discharge circuit to charge the second secondary battery with electricity discharged from the first secondary battery up to the charging-start SOC.

4. The battery control device according to claim 1, wherein
    the diagnosis implementation condition includes at least one of: (a) a condition that a time elapsed since a last diagnosis of a deterioration state of the first secondary battery exceeds a first threshold value; (b) a condition that a SOC of the first secondary battery is equal to or smaller than a second threshold value; or (c) a condition that a time elapsed since a last diagnosis of a deterioration state of the first secondary battery exceeds a third threshold value and the SOC of the first secondary battery is equal to or smaller than a fourth threshold value.

5. The battery control device according to claim 1, wherein
    the processor is configured to report that a stop of use or a reuse of the first secondary battery is recommended if it is determined that the first secondary battery does not satisfy a criterion for at least one diagnosis item.

6. The battery control device according to claim 5, wherein
    the reporting that a reuse is recommended includes notifying a reuse program of the first secondary battery.

7. The battery control device according to claim 6, wherein
    the reuse program includes at least one of a type of reuse, a price regarding reuse, or an expiry date of reuse.

8. The battery control device according to claim 5, wherein
    the first secondary battery is mounted on a device rented to a user,
    the first secondary battery is electrically connected to the charge and discharge circuit after the device is returned by the user, and
    the processor is configured to report that the device is ready to rent when it is determined that the first secondary battery satisfies a criterion for each of at least one diagnosis item.

9. The battery control device according to claim 1, wherein
    the processor is configured to analyze a charging curve of the first secondary battery represented by the measurement data, and there by configured to estimate the internal state parameter.

10. A charge and discharge system comprising:
    the battery control device according to claim 1; and
    a first device on which the first secondary battery is mounted, and which is connectible to the charge and discharge circuit.

11. The charge and discharge system according to claim 10, wherein
    if it is determined that the diagnosis implementation condition is satisfied and a second secondary battery mounted on a second device differing from the first device is electrically connected to the charge and discharge circuit, the processor is configured to control the charge and discharge circuit to charge the second secondary battery with electricity discharged from the first secondary battery up to the charging-start SOC.

12. A parking lot system comprising:
    the battery control device according to claim 1 installed in a parking lot; and
    a first vehicle on which the first secondary battery is mounted, wherein
    the first secondary battery is electrically connected to the charge and discharge circuit after the first vehicle is parked in the parking lot.

13. The parking lot system according to claim 12, wherein
    if it is determined that the diagnosis implementation condition is satisfied and a second secondary battery mounted on a second vehicle differing from the first vehicle is electrically connected to the charge and discharge circuit, the processor is configured to control the charge and discharge circuit to charge the second secondary battery with electricity discharged from the first secondary battery up to the charging-start SOC.

14. A secondary battery reuse system comprising:
a battery control device according to claim 1, wherein
the processor is configured to externally provide a reuse program of the first secondary battery if the first secondary battery is diagnosed as failing to satisfy criterion of at least one diagnosis item.

15. The secondary battery reuse system according to claim 14, wherein
the processor is configured to report that the first secondary battery will be remanufactured as a secondary battery to be mounted on a battery product, upon acquisition of information indicating that an owner of the first secondary battery agrees to the reuse program.

16. The secondary battery reuse system according to claim 14, further comprising
a server, wherein
the processor is configured to make an inquiry to the server regarding a reuse program available for the first secondary battery, and configured to further provide a reuse program sent by the server in response to the inquiry.

17. A battery control method comprising:
acquiring information relating to a first secondary battery electrically connected to a charge and discharge circuit capable of charging and discharging an electrically connected secondary battery;
determining whether or not a diagnosis implementation condition regarding the first secondary battery is satisfied based on the information regarding the first secondary battery;
controlling the charge and discharge circuit to charge the first secondary battery only after discharging or charging the first secondary battery up to a charging start SOC if it is determined that the diagnosis implementation condition is satisfied;
acquiring measurement data of a voltage and a current of the first secondary battery while the first secondary battery is charged from the charging-start SOC;
estimating an internal state parameter of the first secondary battery based on the measurement data; and
diagnosing a deterioration state of the first secondary battery based on an estimated value of the internal state parameter of the first secondary battery.

18. A non-transitory storage medium storing a battery control program causing a computer to:
acquire information relating to a first secondary battery electrically connected to a charge and discharge circuit capable of charging and discharging an electrically connected secondary battery;
determine whether or not a diagnosis implementation condition regarding the first secondary battery is satisfied based on the information regarding the first secondary battery;
control the charge and discharge circuit to charge the first secondary battery only after discharging or charging the first secondary battery up to a charging-start SOC if it is determined that the diagnosis implementation condition is satisfied;
acquire measurement data of a voltage and a current of the first secondary battery while the first secondary battery is being charged from the charging-start SOC;
estimate an internal state parameter of the first secondary battery based on the measurement data; and
diagnose a deterioration state of the first secondary battery based on an estimated value of the internal state parameter of the first secondary battery.

\* \* \* \* \*